(12) United States Patent
Tønnes et al.

(10) Patent No.: US 12,261,543 B2
(45) Date of Patent: Mar. 25, 2025

(54) THREE-LEVEL POWER MODULE

(71) Applicant: Danfoss Silicon Power GMBH, Flensburg (DE)

(72) Inventors: Michael Tønnes, Nordborg (DK); Ole Mühlfeld, Nordborg (DK); Tim Rettmann, Nordborg (DK)

(73) Assignee: DANFOSS SILICON POWER GMBH, Flensburg (DE)

( * ) Notice: Subject to any disclaimer, the term of this patent is extended or adjusted under 35 U.S.C. 154(b) by 567 days.

(21) Appl. No.: 17/613,156

(22) PCT Filed: May 11, 2020

(86) PCT No.: PCT/EP2020/063045
§ 371 (c)(1),
(2) Date: Nov. 22, 2021

(87) PCT Pub. No.: WO2020/239421
PCT Pub. Date: Dec. 3, 2020

(65) Prior Publication Data
US 2022/0319976 A1    Oct. 6, 2022

(30) Foreign Application Priority Data
May 26, 2019    (DE) ............ 10 2019 114 040.4

(51) Int. Cl.
*H02M 7/00*    (2006.01)
*H01L 23/50*    (2006.01)
(Continued)

(52) U.S. Cl.
CPC ............ *H02M 7/003* (2013.01); *H01L 23/50* (2013.01); *H01L 25/072* (2013.01); *H01L 25/18* (2013.01); *H02M 7/483* (2013.01); *H02M 7/5387* (2013.01)

(58) Field of Classification Search
CPC .... H02M 7/003; H02M 7/483; H02M 7/5387; H01L 23/50; H01L 25/072; H01L 25/18;
(Continued)

(56) References Cited

U.S. PATENT DOCUMENTS

| 5,539,232 A | 7/1996 | Nakanishi et al. |
| 6,939,743 B2 | 9/2005 | Frey |

(Continued)

FOREIGN PATENT DOCUMENTS

| DE | 112013001234 T5 | 1/2015 |
| DE | 102016117248 B4 | 7/2019 |

(Continued)

OTHER PUBLICATIONS

"Substrate Layout Evaluation for T-type Three-level IGBT Module", Nan Zhu, 2014 IEEE ECCE, Sep. 2014. (Year: 2014).*

(Continued)

*Primary Examiner* — S M Sohel Imtiaz
(74) *Attorney, Agent, or Firm* — McCormick, Paulding & Huber PLLC

(57) ABSTRACT

A power module (2) including a molded package (4), three power terminals (6, 8, 10) protruding from a first side (40) of the molded package (4) is disclosed. The power terminals (6, 8, 10) include a positive DC terminal (6), a neutral terminal (8) and a negative terminal (10). The power module (2) includes a phase output power terminal (12) protruding from a second side (42) of the molded package (4). The power module (2) is a three-level power module including a plurality of control pins (14, 16, 18, 20, 22, 24, 26, 28, 30, 32, 34, 36) protruding from the second side (42) of the molded package (4).

22 Claims, 4 Drawing Sheets

(51) Int. Cl.
*H01L 25/07* (2006.01)
*H01L 25/18* (2023.01)
*H02M 7/483* (2007.01)
*H02M 7/5387* (2007.01)

(58) Field of Classification Search
CPC ......... H01L 23/49541; H01L 23/49562; H01L 23/49575
See application file for complete search history.

(56) References Cited

U.S. PATENT DOCUMENTS

| | | | |
|---|---|---|---|
| 7,342,262 B2 | 3/2008 | Frey et al. | |
| 8,300,443 B2 | 10/2012 | Takizawa | |
| 9,899,283 B2 | 2/2018 | Cottet et al. | |
| 11,532,600 B2 | 12/2022 | Mari Curbelo et al. | |
| 2011/0242866 A1* | 10/2011 | Takizawa | H02M 7/487 363/131 |
| 2016/0172995 A1* | 6/2016 | Obiraki | H01L 25/162 361/728 |
| 2017/0148710 A1* | 5/2017 | Steigler | H01L 23/3735 |
| 2017/0338162 A1* | 11/2017 | Cottet | H01L 23/24 |
| 2019/0140557 A1* | 5/2019 | Zhang | H02M 7/48 |
| 2019/0149064 A1* | 5/2019 | Lefevre | H02M 1/44 363/131 |
| 2019/0304946 A1* | 10/2019 | Cottet | H01L 23/645 |
| 2020/0066686 A1* | 2/2020 | Mohn | H01L 25/072 |

FOREIGN PATENT DOCUMENTS

| | | |
|---|---|---|
| EP | 057810 B1 | 6/1998 |
| EP | 2996233 A1 | 3/2016 |
| EP | 3246945 B1 | 10/2018 |
| EP | 3484038 A1 | 5/2019 |
| JP | 3705755 B2 | 10/2005 |
| WO | WO-2018130409 A1 * | 7/2018 ............ H02M 7/487 |
| WO | 2018202620 A1 | 11/2018 |

OTHER PUBLICATIONS

International Search Report for PCT/EP2020/061179 Dated Jun. 9, 2020.

Zhu, N., et al., "Substrate Layout Evaluation for T-type Three-level IGBT Modules", IEEE (2014), pp. 4677-4684 (Year: 2014).

International Search Report for PCT/EP2020/063045 Dated Jun. 15, 2020.

* cited by examiner

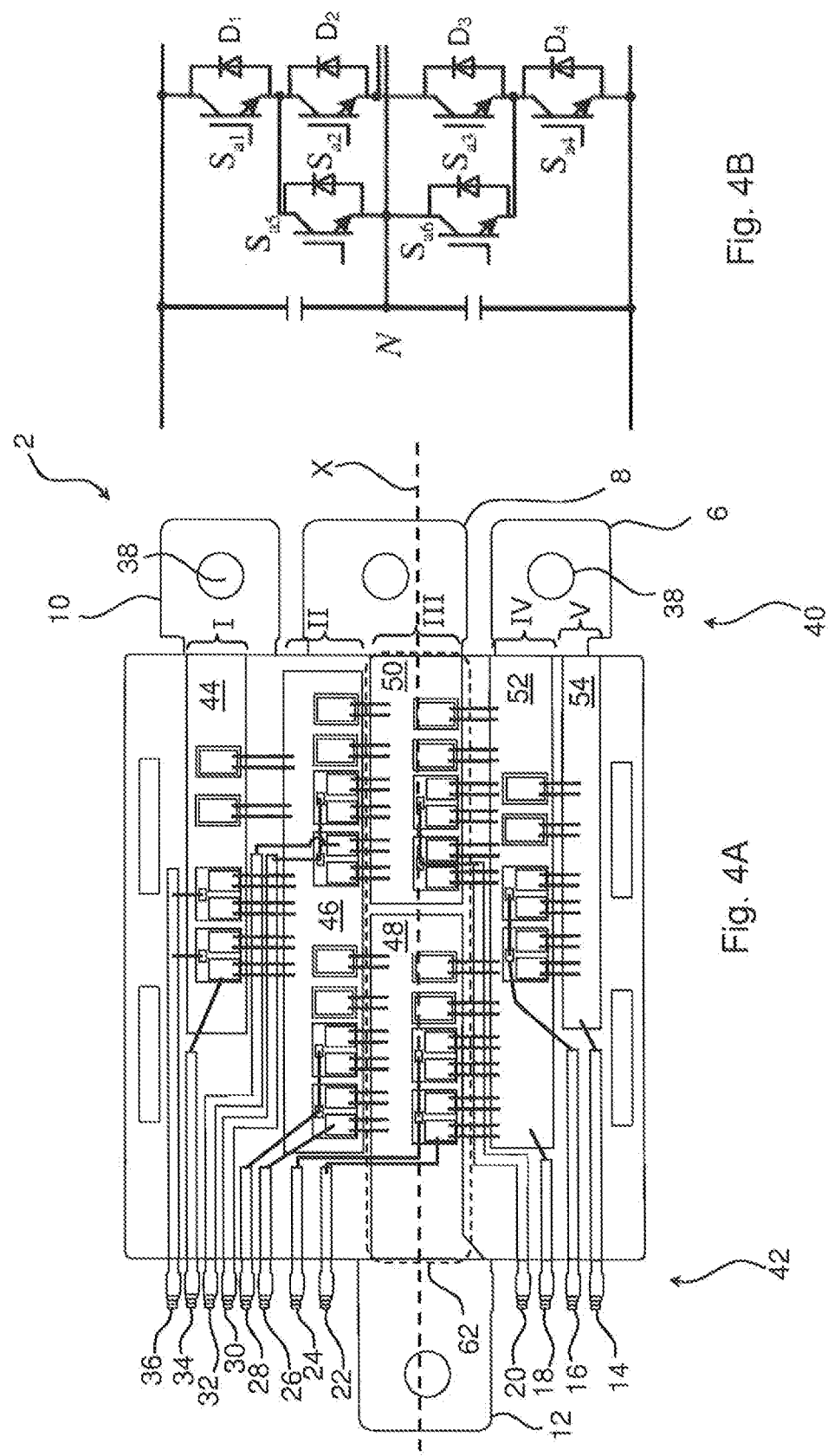

THREE-LEVEL POWER MODULE

CROSS-REFERENCE TO RELATED APPLICATION

This application is a National Stage application of International Patent Application No. PCT/EP2020/063045, filed on May 11, 2020, which claims priority to German Application No. 102019114040.4 filed on May 26, 2019, each of which is hereby incorporated by reference in its entirety.

TECHNICAL FIELD

The present invention relates to a power module for inverters. The invention relates to a power module applicable in automotive traction inverters (e.g. for mobile power functions) as well as applications, in which size restrictions are of concern (e.g. compressors).

BACKGROUND

Power modules are used in various applications. When used in inverters, however, the power modules are typically based on two-level systems, where the DC voltage between two supplies is switched to form an AC output (or vice versa). State of the art power molded power modules contain half-bridge topologies, where a phase leg is formed by two transistors and two diodes. In automotive traction inverters (e.g. for mobile power functions) as well as applications in which size restrictions are of concern (e.g. compressors) three-level topologies where three DC supplies are utilised enable better performance for high output frequencies, better sinus shape and improved EMI behavior compared to two-level half-bridges. Such topologies will support utilization of high rpm motors as well as the design of compact high-power drives.

To increase switching speed and by doing so to optimize sinusoidal waveforms and reduce losses there has been an increasing use of cost-effective silicon carbide (SiC) based high-power switching elements.

It would, however, be advantageous to have an alternative way of providing a power module, in which the shape of the sine output requires less filtering than the prior art power modules and in which the overall efficiency can be increased. Accordingly, it is an object of the invention to provide an alternative to the prior art power modules for inverters. It is also an object of the invention to provide a power module applicable in automotive traction inverters (e.g. for mobile power functions) as well as applications, in which size restrictions are of concern (e.g. compressors).

Accordingly, it is an object of the invention to provide an alternative to the prior art power modules for inverters, by which power module it is possible to increase the output power, provide a high degree of thermal spreading and provide higher lifetime.

SUMMARY

The object of the present invention can be achieved by a power module as defined in claim 1. Preferred embodiments are defined in the dependent subclaims, explained in the following description and illustrated in the accompanying drawings.

The power module according to the invention is a power module comprising:
a molded package;
three power terminals protruding from a first side of the molded package, wherein these power terminals include a positive DC terminal, a neutral terminal and a negative terminal;
a phase output power terminal protruding from a second side of the molded package, wherein the power module is a three-level power module comprising a plurality of control pins protruding from the second side of the molded package, wherein:
a) a metallisation area is electrically connected to the neutral terminal;
b) another metallisation area is electrically connected to the phase output power terminal,
c) the metallisation areas are separated metallisation areas shaped as elongated structures having a longitudinal axis extending along an axis and
d) the metallisation areas extend in extension of each other along the axis.

Hereby, it is possible to provide a power module that makes it possible to increase the output power, provide a high degree of thermal spreading and provide higher lifetime. The power module moreover, provides an alternative to the prior art inverters that are based on a two-level topology. Such power module would be advantageous in automotive traction inverters (e.g. for mobile power functions) as well as applications, in which size restrictions are of concern (e.g. compressors) and solar inverter application. Application of a three-level power module as alternative to a two-level power module results in smaller harmonics.

In one embodiment, the neutral terminal is in the center between positive terminal and the negative terminal. This makes integration to customer systems easier and busbar structures in these applications can be made with three layers and the arrangement simplifies the interface (busbar stack: positive/neutral/negative).

By structuring the internal layout into metallization areas that are elongated structures enables the use of multiple chips in parallel, placed in a row, as sufficient space is available provided. This increases output power and it allows to use multiple smaller die in parallel, having benefit for thermal spreading.

By structuring the internal layout into metallization areas that are elongated structures it is possible to lower the parasitic inductance as the commutation loops are made in a "wide but short" geometry (meaning the current flows in multiple devices and wires in parallel, thus reducing stray inductance compared to a geometry where traces are narrow and long).

By placing the two metallisation areas within the central area of the power module in a manner, in which the two metallisation areas extend along a common axis (e.g. the longitudinal axis of the power module), it is possible to enable a good heat transfer of losses of the chips placed on the metallisation areas. The enhanced heat transfer can be achieved because the module cooling is typically best in the center region, in which no edge-effects occur to the thermal paths.

By placing the two metallisation areas within the central area of the power module in a manner, in which the two metallisation areas extend along a common axis (e.g. the longitudinal axis of the power module), it is possible to extend the lifetime of the power module. Degradation effects of system solder (bonding of DBC to baseplate) and substrate delamination (CU coming off the ceramic) starts at corners and edges. Accordingly, a higher number of temperature cycles can be allowed when the chips are arranged in the central area of the power module.

By placing the two metallisation areas within the central area of the power module in a manner, in which the two metallisation areas extend along a common axis it is possible to achieve a symmetric layout that enables good switching symmetry between upper and lower switches, or between the inner switches. The loss generation of the opposing switch functions will be more symmetric. Accordingly, the need for derating can be reduced or even eliminated By placing the two metallisation areas within the central area of the power module in a manner, in which the two metallisation areas extend in extension to each other along a common axis, the commutation loop is minimized compared to the situation, in which the traces are arranged with a larger distance to each other (the layout features a short loop).

In one embodiment, the second side of the molded package is positioned in the opposite end of the power module than the first side.

In on embodiment, the three power terminals protruding from the first side of the molded package are arranged in such a manner that the outer terminals form the positive DC terminal and the negative DC terminal, respectively, and that the inner terminal (arranged between the outer terminals) forms neutral terminal.

It may be an advantage that the power module comprises a Neutral Point Clamped (NPC-1) topology. In one embodiment, the power module comprises chopper or diode bridge modules to reduce the cost.

In another embodiment, the power module comprises a NPC-2 topology.

In a further embodiment, the power module comprises an active neutral-point-clamped (ANPC) topology.

It may be an advantage that the power module comprises at least one metallisation area (e.g. comprising copper) onto which one or more semiconductor switches are arranged, wherein at least two of the semiconductor switches form a half-bridge circuit. In a preferred embodiment, the power module comprises a plurality of metallisation areas being spaced from each other, wherein one or more semiconductor switches are arranged on at least some of the metallisation areas. Hereby, it is possible to provide a cost-effective power module.

It has to be understood that the metallisation areas may be electrically interconnected within the power module, for example via wire bonds. Moreover, electric components arranged on the metallisation areas may be connected to one or more control pins by electric connectors such as wire bonds.

In one embodiment, the metallisation areas are formed as elongated structures extending parallel to each other.

It may be an advantage that the metallisation areas are arranged in five rows. Hereby, it is possible to a row of connect electronic components (e.g. switching elements) provided on a metallisation area with an adjacent metallisation area by using a series of short electric connectors such as wire bonds.

In one embodiment, the central (midmost) row of metallisation area comprises two separated metallisation areas.

It may be beneficial that the semiconductors are bonded to the outermost four rows of metallisation areas.

In one embodiment, no semiconductors are arranged at the rows metallisation areas others than the outermost four rows.

It may be advantageous that the phase output power terminal is electrically connected to a first metallisation area and that the neutral terminal is electrically connected to a second metallisation area, wherein an additional metallisation area is arranged between and spaced from the first metallisation area and the second metallisation area.

In one embodiment, one or more semiconductor switches are arranged on the first metallisation area and on the additional metallisation area, wherein no semiconductor switches are arranged on the second metallisation area.

In one embodiment, one or more semiconductor switches are arranged on a further metallisation area being electrically connected to the positive DC terminal.

It may be advantageous that an even other metallisation area is electrically connected to the negative DC terminal, wherein no semiconductor switches are arranged on said metallisation area.

In one embodiment, the metallisation areas of at least a subset of the metallisation areas are arranged substantially mirror symmetrically with respect to a symmetric axis.

In one embodiment, all metallisation areas are arranged essentially mirror symmetrically with respect to a symmetric axis.

It may be an advantage that a number of control pins protrude from the molded package in such a manner that the control pins extend along the same plane.

In one embodiment, the control pins protrude from the second side of the molded package. Hereby, it is easier to electrically connect the power module to a device.

In one embodiment, the power module comprises eight control pins.

In one embodiment, the power module comprises nine control pins.

In one embodiment, the power module comprises ten control pins.

In one embodiment, the power module comprises eleven control pins.

In one embodiment, the power module comprises twelve control pins. It may be an advantage that the control pins extend parallel to each other and have the same geometry.

In one embodiment, the power module comprises at least one metallisation area onto which one or more semiconductor switches are arranged.

It may be an advantage that the one or more of the semiconductor switches are silicon carbide (SiC) semiconductors.

In one embodiment, the power module comprises one or more SiC Metal-Oxid Semiconductor Field Effect Transistors (MOSFETs).

In one embodiment, the power module comprises at least one metallisation area onto which one or more insulated-gate bipolar transistors (IGBTs) are arranged.

In one embodiment, at least one circuit element is formed from a copper layer of a direct bonded copper (DBC) substrate.

In one embodiment, the power module comprises five metallisation areas being spaced from each other.

In one embodiment, the power module comprises six metallisation areas being spaced from each other.

It may be an advantage that two or more of the metallisation areas have the same geometric shape In one embodiment, the semiconductor switches comprise one or more semiconductor chips, wherein one or more connectors of semiconductor switches are bonded directly to the surface of the chips.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings:

FIG. 4A shows a power module according to one embodiment of the invention and

FIG. 4B shows an equivalent circuit of the power module shown in FIG. 4A.

DETAILED DESCRIPTION

Figure 1:
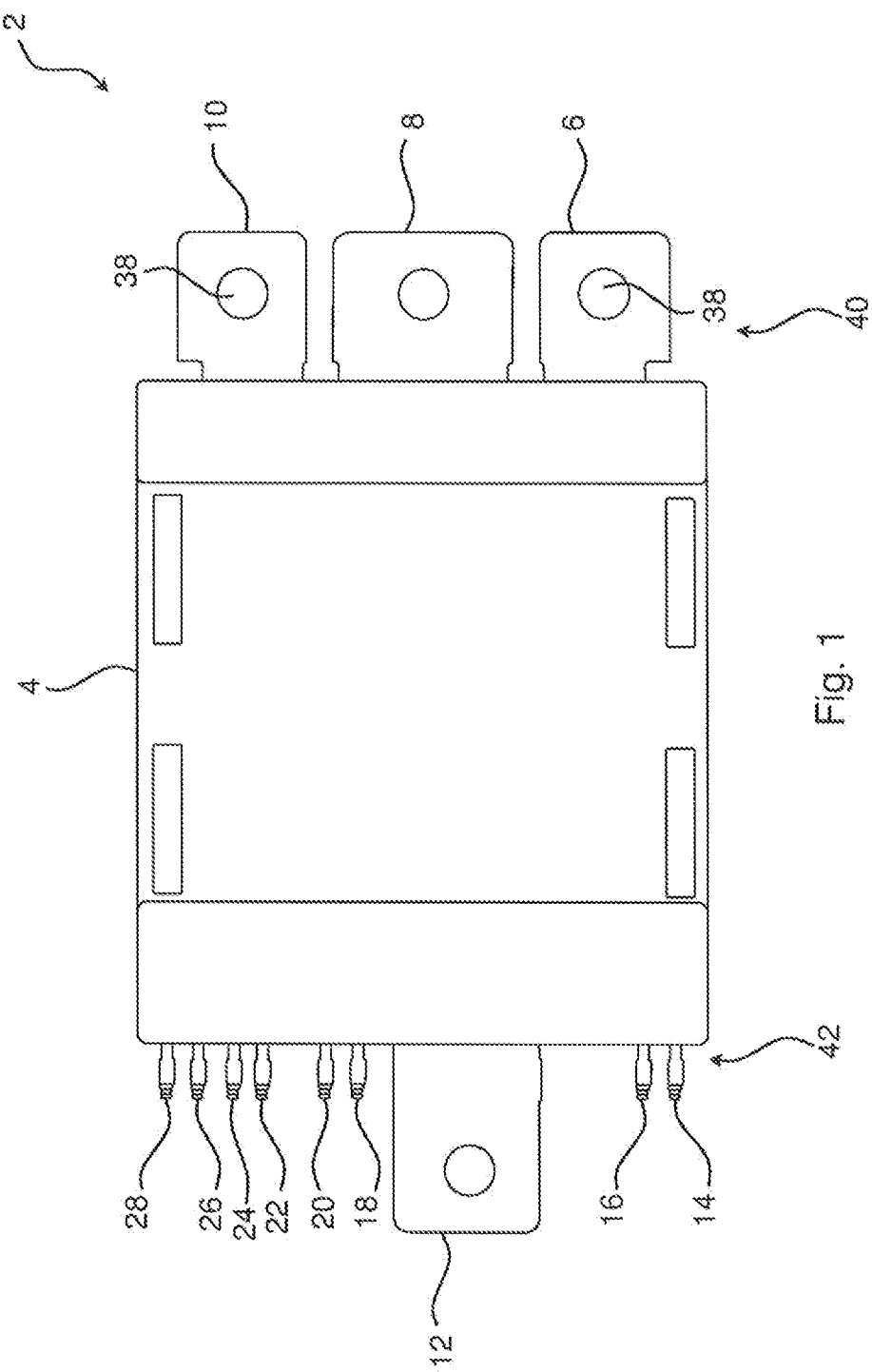
FIG. 1 shows a power module according to an embodiment of the invention.

Referring now in detail to the drawings for the purpose of illustrating preferred embodiments of the present invention, a power module 2 of the present invention is illustrated in FIG. 1.

FIG. 1 illustrates a power module 2 according to an embodiment of the invention. The power module 2 is a three-level power module and comprises a molded package 4 comprising a first side 40 and a second opposite side 42. Three power terminals 6, 8, 10 protrude from the first side 40 of the molded package 4. The power terminals 6, 8, 10 include a positive DC terminal 6, a neutral terminal 8 and a negative terminal 10.

The phase output power terminal 12 protrudes from the second side 42 of the molded package 4. The power module 2 comprises a plurality of control pins 14, 16, 18, 20, 22, 24, 26, 28 protruding from the second side 42 of the molded package 4. These control pins 14, 16, 18, 20, 22, 24, 26, 28 extend parallel to each other.

A centrally arranged hole 38 is provided in each of the power terminals 6, 8, 10, 12. The holes 38 may be used to mechanically and electrically attach the terminals 6, 8, 10, 12 to other parts (e.g. a DC link) by means of screws (not shown) being inserted through holes 38. Each screw will typically be screwed into a corresponding nut. Accordingly, the screws can mechanically keep the terminals 6, 8, 10, 12 of the power module 2 in contact with the structures, to which the terminals 6, 8, 10, 12 are electrically connected. Other means of attachment may also be used where necessary, such as welding, gluing, soldering, brazing, or other means known in the field. Some attachment means may not require the presence of a hole 38.

In one embodiment, the molded package 4 is encapsulating the electronic components of the power module 2. In one embodiment, the molded package 4 encapsulates a base plate of the power module 2.

Figures 2A, 2B:
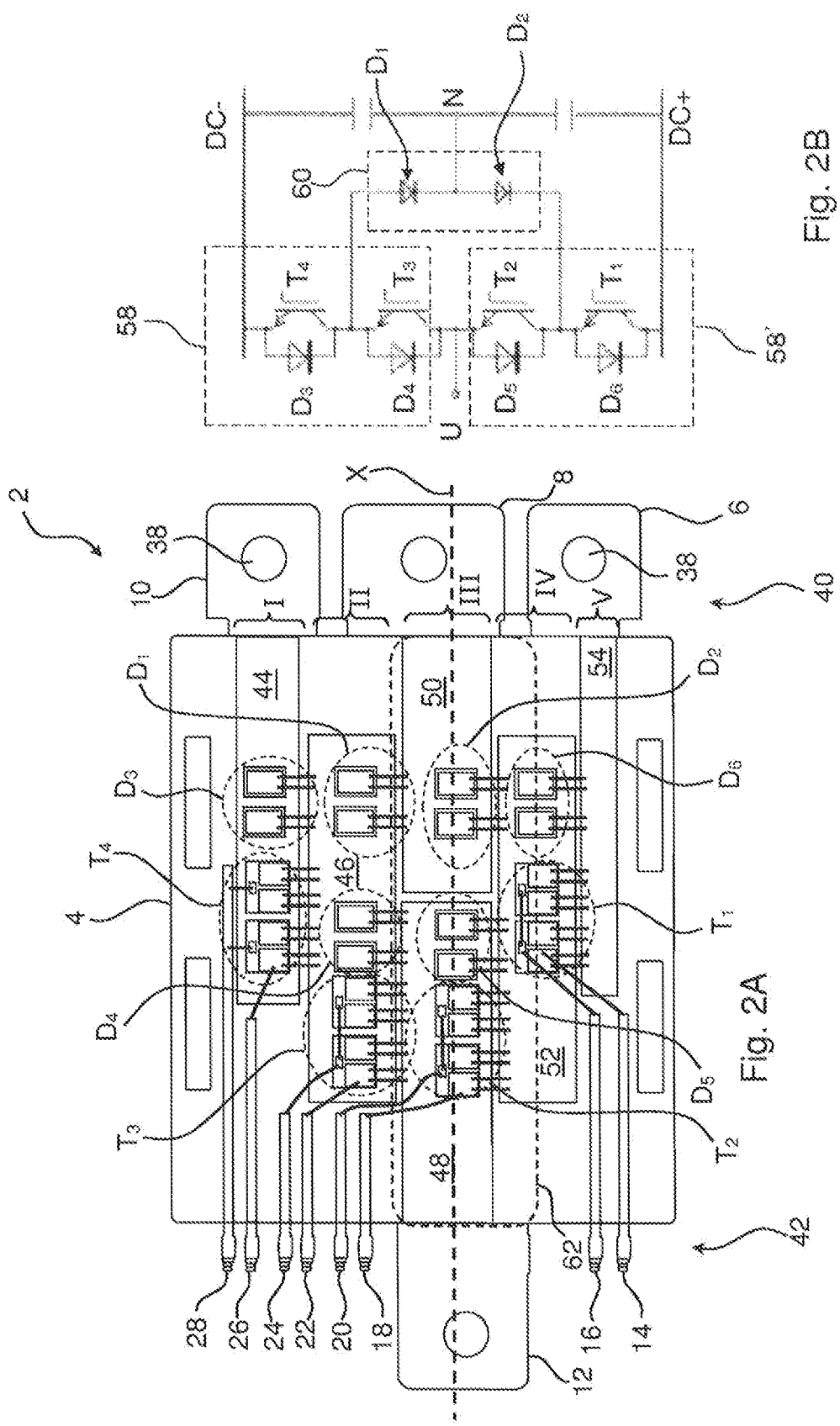
FIG. 2A shows another view of the power module shown in FIG. 1.
FIG. 2B shows an equivalent circuit of the power module shown in FIG. 2A.

FIG. 2A illustrates a top view of the power module 2 in Neutral Point Clamped (NPC)-1 topology shown in FIG. 1. Besides from the structures shown in FIG. 1, it can be seen that the power module 2 comprises several electrically separated metallisation areas 44, 46, 48, 50, 52, 54. A first metallisation area 44 is electrically connected to the negative DC terminal 10. A semiconductor switch $T_4$ and a diode $D_3$ are arranged on the first metallisation area 44.

A second metallisation area 46 is arranged between the first metallisation area 44 and a third metallisation areas 48 that is electrically connected to the phase output power terminal 12. A semiconductor switch $T_3$ and two diodes $D_1$ and $D_4$ are arranged on the second metallisation area 46. A semiconductor switch $T_2$ and a diode $D_5$ are arranged on the third metallisation area 48.

A fourth metallisation area 50 is electrically connected to the neutral terminal 8. A diode $D_2$ is arranged on the fourth metallisation area 50.

A fifth metallisation area 52 is arranged between the fourth metallisation areas 50 and a sixth metallisation area 54 that is electrically connected to the positive DC terminal 6. A semiconductor switch $T_1$ and a diode $D_6$ are arranged on the fifth metallisation area 52.

The metallisation areas 44, 46, 48, 50, 52, 54 are shaped as elongated structures having a longitudinal axis extending along the axis X. It can be seen that the metallisation areas 44, 46, 48, 50, 52, 54 are substantially mirror symmetrically arranged with respect to the axis X. Moreover, the metallisation areas 44 and 54 are substantially mirror symmetrically arranged with respect to the axis X. Likewise, the metallisation areas 46 and 52 are basically mirror symmetrically arranged with respect to the axis X, whereas the metallisation areas 48 and 50 are essentially mirror symmetrically arranged with respect to the axis X.

Hereby, it is possible to provide a design having a lower number of electrical interconnections.

The control pins 14, 16 are electrically connected to electronic components arranged on the fifth metallisation area 52. The control pins 18, 20 are electrically connected to electronic components arranged on the third metallisation area 48. The control pins 22, 24 are electrically connected to electronic components arranged on the second metallisation area 46. The control pins 26, 28 are electrically connected to electronic components arranged on the first metallisation area 44.

The power module 2 comprises a first row I, a second row II, a third row III, a fourth row IV and a fifth row V. The first metallisation area 44 is arranged in the first row I. The second metallisation area 46 is arranged in the second row II. Both the third metallisation area 48 and the fourth metallisation area 50 are arranged in the third row III. The fifth metallisation area 52 is arranged in the fourth row IV and the sixth metallisation area 54 is arranged in the fifth row V. It can be seen that central (midmost) row III of metallisation area comprises two separated metallisation areas 48, 50. Accordingly, the separated metallisation areas 48, 50 are arranged in the central area 62 of the power module 2. The central area 62 is indicated with a dotted rounded rectangle.

Moreover, it can be seen that the semiconductor switches $T_1$, $T_2$, $T_3$, $T_4$ are bonded to the outermost four rows I, II, III, IV.

It can also be seen that no semiconductor switches $T_1$, $T_2$, $T_3$, $T_4$ are arranged at the rows others than the outermost four rows I, II, III, IV.

FIG. 2B illustrates an equivalent circuit of the power module shown in FIG. 2A.

Two diodes $D_3$, $D_4$ (arranged in series) and two semiconductor switches $T_3$, $T_4$ (arranged in series) constituting a first half bridge 58 are provided between the positive DC terminal DC+ and the phase terminal U (shown as 12 in FIG. 2A).

Likewise, two diodes $D_5$, $D_6$ (arranged in series) and two semiconductor switches $T_2$, $T_1$ (arranged in series) constituting a second half bridge 58' are provided between the negative DC terminal DC− and the phase terminal U.

Two diodes $D_1$, $D_2$ are arranged in series and constitute a diode bridge 60.

Figures 3A, 3B:
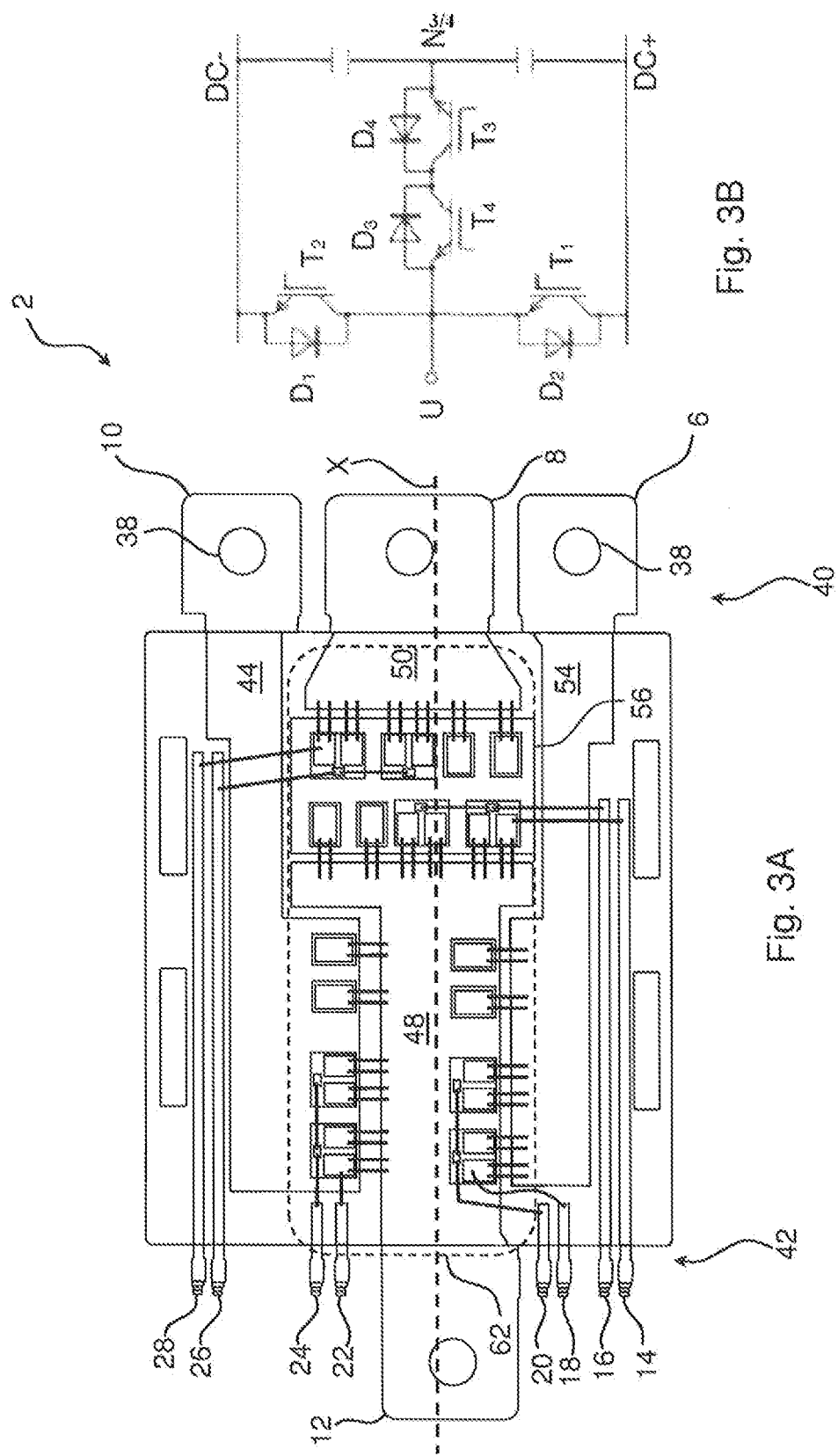
FIG. 3A shows a power module according to one embodiment of the invention.
FIG. 3B shows an equivalent circuit of the power module shown in FIG. 3A.

FIG. 3A illustrates a power module 2 according to one embodiment of the invention, whereas FIG. 3B illustrates an equivalent circuit of the power module (NPC2 T-type topology) shown in FIG. 3A. FIG. 3A illustrates a top view of the power module 2 comprising a plurality of metallisation areas 44, 48, 50, 52, 54, 56 spaced apart from each other.

The power module 2 is a three-level power module 2 and comprises a first side 40 and a second opposite side 42. Three power terminals 6, 8, 10 protrudes from the first side 40 of the power module 2. The power terminals 6, 8, 10 include a positive DC terminal 6, a neutral terminal 8 and a negative terminal 10. The phase output power terminal 12 protrudes from the second side 42 of the power module 2. The power module 2 comprises a plurality of control pins 14, 16, 18, 20, 22, 24, 26, 28 protruding from the second side 42 of the power module 2. These control pins 14, 16, 18, 20, 22, 24, 26, 28 are extending parallel to an axis X indicated with a dotted line.

A first metallisation area 44 is electrically connected to the negative DC terminal 10. Two control pins 22, 24 are electrically connected to electronic components arranged on this first metallisation area 44.

Another metallisation area 48 is electrically connected to the phase output power terminal 12. A further metallisation area 50 is electrically connected to the neutral terminal 8. Two control pins 18, 20 are electrically connected to electronic components arranged on this metallisation area 48.

A metallisation area 54 is electrically connected to the positive DC terminal 6.

A metallisation area 56 is arranged between the metallisation area 48 and the metallisation area 50. Two control pins 26, 28 are electrically connected to electronic components arranged on this metallisation area 56.

The metallisation areas 44, 48, 50, 52, 54 are substantially mirror symmetrically arranged with respect to the axis X. The axis X basically corresponds to the longitudinal axis of the power module 2

It can be seen that the metallisation areas 44 and 54 are essentially mirror symmetrically arranged with respect to the axis X. Likewise, the metallisation areas 48, 50 and 56 are basically mirror symmetrically arranged with respect to the axis X.

The separated metallisation areas 48, 50, 56 are arranged in the central area 62 of the power module 2. The central area 62 is indicated with a dotted rounded rectangle.

FIG. 3B illustrates an equivalent circuit of the power module shown in FIG. 3A.

Two diodes $D_3$, $D_4$ (arranged in series) and two semiconductor switches $T_3$, $T_4$ (arranged in series) are provided between the neutral terminal N and the phase terminal U (shown as 12 in FIG. 3A).

A diode $D_1$ and a semiconductor switch $T_2$ are arranged between the negative DC terminal DC- and the phase terminal U. Similarly, a diode $D_2$ and a semiconductor switch $T_1$ are arranged between the positive DC terminal DC+ and the phase terminal U.

FIG. 4A illustrates a power module 2 according to one embodiment of the invention, whereas FIG. 4B illustrates an equivalent circuit of the power module (Advanced Neutral Point Clamping (ANPC) topology) shown in FIG. 4A.

FIG. 4A illustrates a top view of the power module 2 comprising a plurality of metallisation areas 44, 46, 48, 50, 52, 54 spaced apart from each other.

The power module 2 comprises a first side 40 and a second opposite side 42. Three power terminals 6, 8, 10 (a positive DC terminal 6, a neutral terminal 8 and a negative terminal 10) protrudes from the first side 40 of the power module 2. The phase output power terminal 12, however, protrudes from the second side 42 of the power module 2.

The power module 2 comprises a plurality of control pins 14, 16, 18, 20, 22, 24, 26, 28, 30, 32, 34, 36 protruding from the second side 42 of the power module 2. These control pins 14, 16, 18, 20, 22, 24, 26, 28, 30, 32, 34, 36 are extending parallel to an axis X indicated with a dotted line.

The power module 2 comprises a first metallisation area 44 being electrically connected to the negative DC terminal 10. Two control pins 34, 36 are electrically connected to electronic components arranged on this first metallisation area 44.

Another metallisation area 48 is electrically connected to the phase output power terminal 12. Two control pins 22, 24 are electrically connected to electronic components arranged on this metallisation area 48.

A further metallisation area 50 is electrically connected to the neutral terminal 8. A control pin 20 is electrically connected to an electronic component arranged on this metallisation area 50

A metallisation area 54 is electrically connected to the positive DC terminal 6. A control pin 14 are electrically connected to this metallisation area 54.

A metallisation area 52 is arranged between the metallisation area 54 and the metallisation area 50. Two control pins 16, 18 are electrically connected to electronic components arranged on this metallisation area 52.

A metallisation area 46 is arranged between the metallisation area 44 and the metallisation area 50. Four control pins 26, 28, 30, 32 are electrically connected to electronic components arranged on this metallisation area 46.

The metallisation areas 44, 46, 48, 50, 52, 54 are substantially mirror symmetrically arranged with respect to the axis X. The axis X basically corresponds to the longitudinal axis of the power module 2.

The metallisation areas 44 and 54 are elongated and are essentially mirror symmetrically arranged with respect to the axis X. Likewise, the metallisation areas 48, 50 are basically mirror symmetrically arranged with respect to the axis X, whereas the metallisation areas 46, 52 are basically mirror symmetrically arranged with respect to the axis X.

The power module 2 comprises a first row I, a second row II, a third row III, a fourth row IV and a fifth row V. The first metallisation area 44 is arranged in the first row I. The second metallisation area 46 is arranged in the second row II. Both the third metallisation area 48 and the fourth metallisation area 50 are arranged in the third row III. The fifth metallisation area 52 is arranged in the fourth row IV and the sixth metallisation area 54 is arranged in the fifth row V. The central (midmost and third) row III of metallisation area comprises two separated metallisation areas 48, 50. Accordingly, the separated metallisation areas 48, 50 are arranged in the central area 62 of the power module 2. The central area 62 is indicated with a dotted rounded rectangle.

Moreover, it can be seen that the semiconductor switches are bonded to the outermost four rows I, II, III, IV.

It can also be seen that no semiconductor switches are arranged at the rows others than the outermost four rows I, II, III, IV.

FIG. 4B illustrates an equivalent circuit of the power module shown in FIG. 4A. The power module comprises two diodes $D_1$, $D_2$ (arranged in series) and two semiconductor switches $S_{a1}$, $S_{a2}$ (arranged in series) constituting a first half bridge. The power module further comprises two diodes $D_3$, $D_4$ (arranged in series) and two semiconductor switches $S_{a3}$, $S_{a4}$ (arranged in series) constituting a second half bridge as well as a third half bridge comprising two diodes and two semiconductor switches $S_{a5}$, $S_{a6}$.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A power module comprising:
   a molded package;
   three power terminals protruding from a first side of the molded package, wherein these power terminals include a positive DC terminal, a neutral terminal and a negative DC terminal; and
   a phase output power terminal protruding from a second side of the molded package, wherein the power module is a three-level power module comprising a plurality of control pins protruding from the second side of the molded package and a plurality of metallisation areas including:
   a) a neutral terminal metallisation area is electrically connected to the neutral terminal;
   b) a phase output power terminal metallisation area is electrically connected to the phase output power terminal, and
   c) the neutral terminal and the phase output power terminal metallisation areas are aligned with each other along a common axis (X) extending from the first side to the second side, wherein the phase output power terminal metallization area has an elongated shape extending parallel to the common axis (X).

2. The power module according to claim 1, wherein the three power terminals protruding from the first side of the molded package are arranged in such a manner that the outer terminals form the positive DC terminal and the negative DC terminal, respectively, and that the inner terminal forms neutral terminal.

3. The power module according to claim 1, wherein the power module comprises a Neutral Point Clamped (NPC)-1 topology.

4. The power module according to claim 1, wherein the power module comprises a Neutral Point Clamped (NPC)-2 topology.

5. The power module according to claim 1, wherein the power module comprises an active neutral-point-clamped topology.

6. The power module according to claim 1, wherein the plurality of metallisation areas comprises at least one metallisation area onto which two or more semiconductor switches are arranged, wherein at least two of the semiconductor switches form a half-bridge circuit.

7. The power module according to claim 1, wherein the power module comprises the plurality of metallisation areas being spaced from each other, wherein one or more semiconductor switches are arranged on at least some of the plurality of metallisation areas.

8. The power module according to claim 7, wherein the plurality of metallisation areas are formed as elongated structures extending parallel to each other.

9. The power module according to claim 8, wherein the plurality of metallisation areas are arranged in five rows.

10. The power module according to claim 9, wherein central (midmost) row comprises two separated metallisation areas.

11. The power module according to claim 9, wherein the semiconductor switches are bonded to four of the five rows.

12. The power module according to claim 11, wherein no semiconductor switches are arranged on the fifth of the five rows.

13. The power module according to claim 1, wherein an additional metallisation area is arranged between and spaced from the phase output power terminal metallisation area and the neutral terminal metallisation area.

14. The power module according to claim 13, wherein one or more semiconductor switches are arranged on the phase output power terminal metallisation area and on the additional metallisation area, and wherein no semiconductor switches are arranged on the neutral terminal metallisation area.

15. The power module according to claim 13, wherein one or more semiconductor switches are arranged on a positive DC terminal metallisation area being electrically connected to the positive DC terminal.

16. The power module according to claim 13, wherein a negative DC terminal metallisation area is electrically connected to the negative DC terminal, and wherein no semiconductor switches are arranged on said negative DC terminal metallisation area.

17. The power module according to claim 6, wherein the neutral terminal and the phase output power terminal metallisation areas are arranged symmetrically with respect to a symmetric axis.

18. The power module according to claim 2, wherein the plurality of metallisation areas comprises at least one metallisation area onto which two or more semiconductor switches are arranged, wherein at least two of the semiconductor switches form a half-bridge circuit.

19. The power module according to claim 3, wherein the plurality of metallisation areas comprises at least one metallisation area onto which two or more semiconductor switches are arranged, wherein at least two of the semiconductor switches form a half-bridge circuit.

20. The power module according to claim 1, wherein the neutral terminal and the phase output power terminal metallisation areas are separated metallisation areas shaped as elongated structures having a longitudinal axis extending along the axis (X).

21. The power module according to claim 17, wherein a positive DC terminal metallisation area is electrically connected to the positive DC terminal, wherein a negative DC terminal metallisation area is electrically connected to the negative DC terminal, and wherein the positive DC terminal and the negative DC terminal metallisation areas are arranged symmetrically with respect to the symmetric axis.

22. The power module according to claim 1, wherein each metallisation area is a unified metallised surface, separated from other metallisation areas by a non-metallised surface.

* * * * *